(12) United States Patent
Jang et al.

(10) Patent No.: US 11,594,675 B2
(45) Date of Patent: Feb. 28, 2023

(54) MAGNETIC TUNNEL JUNCTION STRUCTURE AND INTEGRATION SCHEMES

(71) Applicant: GLOBALFOUNDRIES Singapore Pte. Ltd., Singapore (SG)

(72) Inventors: Suk Hee Jang, Singapore (SG); Funan Tan, Singapore (SG); Naganivetha Thiyagarajah, Virum (DK); Young Seon You, Singapore (SG)

(73) Assignee: GLOBALFOUNDRIES SINGAPORE PTE. LTD., Singapore (SG)

(*) Notice: Subject to any disclaimer, the term of this patent is extended or adjusted under 35 U.S.C. 154(b) by 377 days.

(21) Appl. No.: 16/893,366

(22) Filed: Jun. 4, 2020

(65) Prior Publication Data

US 2021/0384416 A1    Dec. 9, 2021

(51) Int. Cl.
| | |
|---|---|
| *H01L 43/12* | (2006.01) |
| *H01L 43/10* | (2006.01) |
| *G11C 11/16* | (2006.01) |
| *H01L 43/08* | (2006.01) |
| *H01L 27/22* | (2006.01) |
| *H01L 43/02* | (2006.01) |

(52) U.S. Cl.
CPC ............ *H01L 43/12* (2013.01); *G11C 11/16* (2013.01); *H01L 27/222* (2013.01); *H01L 43/02* (2013.01); *H01L 43/08* (2013.01); *H01L 43/10* (2013.01)

(58) Field of Classification Search
CPC ....... H01L 43/12; H01L 27/222; H01L 43/02; H01L 43/08; H01L 43/10; G11C 11/16
USPC .......................................................... 257/421
See application file for complete search history.

(56) References Cited

U.S. PATENT DOCUMENTS

| | | | |
|---|---|---|---|
| 8,772,888 B2 | 7/2014 | Jung et al. | |
| 9,373,782 B2 | 6/2016 | Li et al. | |
| 2005/0146927 A1 | 7/2005 | Costrini | |
| 2014/0042567 A1* | 2/2014 | Jung | H01L 43/12 257/E43.001 |
| 2018/0040813 A1* | 2/2018 | Han | H01L 43/08 |
| 2020/0035906 A1* | 1/2020 | Shum | H01L 43/12 |

FOREIGN PATENT DOCUMENTS

WO    2017155508 A1    9/2017

\* cited by examiner

*Primary Examiner* — Jami Valentine Miller
(74) *Attorney, Agent, or Firm* — David Cain

(57) ABSTRACT

A memory device is provided, the memory device comprising a contact pillar in a dielectric layer. A magnetic tunnel junction may be provided over the contact pillar. A barrier layer may be provided on a sidewall of the magnetic tunnel junction and extending over a horizontal surface of the dielectric layer. A spacer may be provided over the barrier layer.

17 Claims, 8 Drawing Sheets

MAGNETIC TUNNEL JUNCTION STRUCTURE AND INTEGRATION SCHEMES

FIELD OF THE INVENTION

The disclosed embodiments relate generally to magnetic tunnel junction (MTJ) devices, and more particularly, to MTJ devices with high density and integration schemes thereof.

BACKGROUND

A magnetoresistive random access memory (MRAM) device comprises an MTJ whose resistance can be adjusted to represent a logic state "0" or "1". An MTJ comprises two ferromagnetic layers, each of which can hold a magnetic moment, separated by an insulating layer. One of the two layers may be pinned by an anti-ferromagnetic layer (hereinafter "fixed layer") set to a particular polarity. The polarization of the other layer (hereinafter "free layer") may be changed by a particular current direction or application of a sufficiently strong external magnetic field. If the two layers have the same polarization, the resistance of the MTJ will be low whereas if the two layers are of opposite polarization, the resistance will be high.

As integrated circuits continue to scale down, it becomes increasingly difficult to isolate adjacent MTJ stacks in MRAM devices. A space between adjacent MTJ stacks may be filled by a dielectric material. However, the increasingly smaller space between the adjacent MTJ stacks may not be effectively filled due to gapfill issues potentially affecting upper metallization levels. Thus, there is an urgent need for an improved MRAM device to overcome the challenges mentioned above.

SUMMARY

In an aspect of the present disclosure, a memory device is provided. The memory device comprising a contact pillar in a dielectric layer. A magnetic tunnel junction may be provided over the contact pillar. A barrier layer may be provided on a sidewall of the magnetic tunnel junction and extending over a horizontal surface of the dielectric layer. A spacer may be provided over the barrier layer.

In another aspect of the present disclosure, an array of memory devices is provided, the array comprising a first contact pillar and a second contact pillar in a dielectric layer. A first magnetic tunnel junction may be provided over the first contact pillar and a second magnetic tunnel junction may be provided over the second contact pillar. A barrier layer may be provided on a sidewall of the first magnetic tunnel junction and the second magnetic tunnel junction. The barrier layer may extend over a horizontal surface of the dielectric layer. A spacer may be provided over the barrier layer.

In yet another aspect of the present disclosure, a method of fabricating a memory device is provided, the method comprising providing a contact pillar in a dielectric layer. A magnetic tunnel junction over the contact pillar may be provided. A barrier layer on a sidewall of the magnetic tunnel junction and over a horizontal surface of the dielectric layer may be provided. A spacer may be provided over the barrier layer.

Numerous advantages may be derived from the embodiments described below. The memory devices eliminate gapfill issue between adjacent MTJ stacks in high density MRAM arrays thereby leading to improved fabrication and reliability of the devices. The embodiments are compatible with back end of line (BEOL) fabrication of logic devices and lead to faster logic devices due to reduced resistive-capacitive (RC) delay.

BRIEF DESCRIPTION OF THE DRAWINGS

The disclosed embodiments will be better understood from a reading of the following detailed description, taken in conjunction with the accompanying drawings:

FIGS. 2A to 7A illustrate a fabrication process flow for the array of memory devices illustrated in FIG. 1A, according to embodiments of the disclosure.

FIGS. 2B to 7B illustrate a fabrication process flow for the metallization structure in the corresponding logic device illustrated in FIG. 1C, according to embodiments of the disclosure.

Figure 1A:
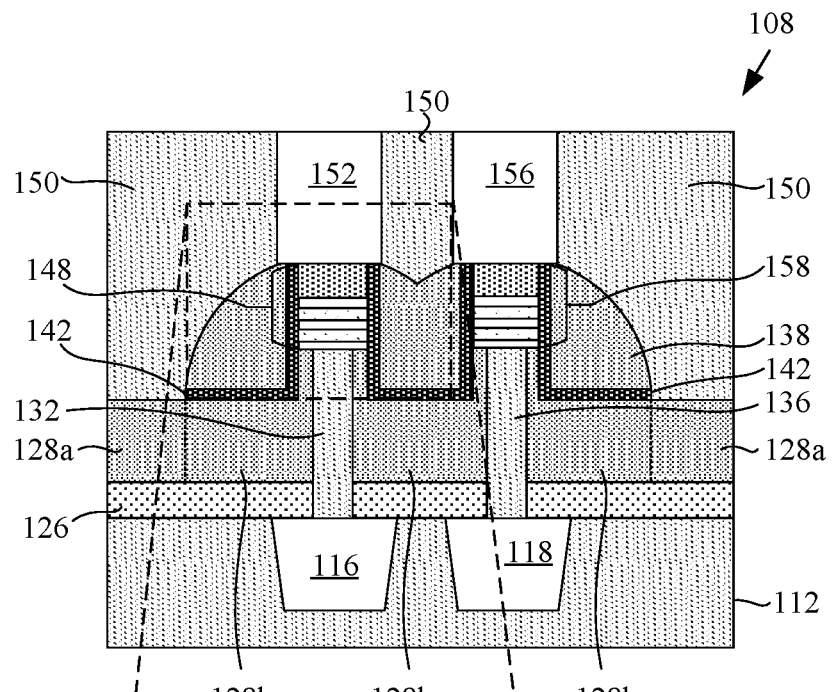
FIG. 1A is a cross-section view of an array of memory devices, according to embodiments of the disclosure.

For simplicity and clarity of illustration, the drawings illustrate the general manner of construction, and certain descriptions and details of well-known features and techniques may be omitted to avoid unnecessarily obscuring the discussion of the described embodiments of the devices. Additionally, elements in the drawings are not necessarily drawn to scale. For example, the dimensions of some of the elements in the drawings may be exaggerated relative to other elements to help improve understanding of embodiments of the devices. The same reference numerals in different drawings denote the same elements, while similar reference numerals may, but do not necessarily, denote similar elements.

DETAILED DESCRIPTION

The following detailed description is exemplary in nature and is not intended to limit the devices or the application and uses of the devices. Furthermore, there is no intention to be bound by any theory presented in the preceding background of the devices or the following detailed description.

FIG. 1A is a cross-section view of an array of memory devices 108, according to embodiments of the disclosure. In embodiments, the array of memory devices 108 may be an MRAM array. Referring to FIG. 1A, the array of memory devices 108 may comprise a dielectric layer 128 having a first portion 128a and a second portion 128b next to the first portion 128a. A first contact pillar 132 and a second contact pillar 136 may be formed in the second portion of the dielectric layer 128b. A first magnetic tunnel junction 148 may be formed over the first contact pillar 132 and a second magnetic tunnel junction 158 may be formed over the second contact pillar 136. A barrier layer 142 may be formed on a sidewall of the first magnetic tunnel junction 148 and the second magnetic tunnel junction 158. The barrier layer 142 may extend over a horizontal surface of the second portion of the dielectric layer 128b. A spacer 138 may cover the barrier layer 142. The spacer 138 covering the barrier layer 142 may be in a gap between the first magnetic tunnel junction 148 and the second magnetic tunnel junction 158. In embodiments, the spacer 138 covering the barrier layer 142 may completely fill the gap between the first magnetic tunnel junction 148 and the second magnetic tunnel junction 158. A low dielectric constant material 150 may be formed over the spacer 138 and the barrier layer 142. The low dielectric constant material 150 may be made of carbon-doped oxide dielectrics comprised of silicon, carbon, oxygen and hydrogen or SiCOH or an ultra-low dielectric constant material. The term "low dielectric constant material" may refer to a dielectric material having a dielectric constant of less than 3.9. The term "ultra-low dielectric constant material" may refer to a dielectric material having a dielectric constant of less than 2.5 and a porosity of more than 5%".

The barrier layer 142 may extend over a sidewall of an upper portion of the second portion of the dielectric layer 128b. The upper portion of the second portion of the dielectric layer 128b may be between the barrier layer 142 and the first contact pillar 132 and between the barrier layer 142 and the second contact pillar 136. The dielectric layer 128 may be made of tetraethyl orthosilicate (TEOS), SiCOH or silicon nitride. In further embodiments, the barrier layer 142 may extend over an upper portion of the first contact pillar 132 and the second contact pillar 136. The spacer 138 may be on an upper surface and a sidewall of the barrier layer 142. The upper surface of the barrier layer 142 may extend over the horizontal surface of the second portion of the dielectric layer 128b. In embodiments, the spacer 138 may completely cover the upper surface of the barrier layer 142. The spacer 138 and the barrier layer 142 may completely cover the sidewall of the first magnetic tunnel junction 148 and the second magnetic tunnel junction 158. The barrier layer 142 may be made of silicon nitride, an oxygen-free dielectric material or any other suitable dielectric material. The spacer 138 may be made of TEOS or silicon nitride.

A first upper metallization layer 152 may be formed over the first magnetic tunnel junction 148 and a second upper metallization layer 156 may be formed over the second magnetic tunnel junction 158. The first upper metallization layer 152 and the second upper metallization layer 156 may be formed in the low dielectric constant material 150.

An NBloK layer 126 may surround a lower portion of the first contact pillar 132 and a lower portion of the second contact pillar 136. The NBloK layer 126 may be formed between the dielectric layer 128 and a low dielectric constant material 112. A first lower metallization layer 116 and a second lower metallization layer 118 may be formed in the low dielectric constant material 112 and contacting a bottom portion of the first contact pillar 132 and the second contact pillar 136, respectively.

Figure 1B:
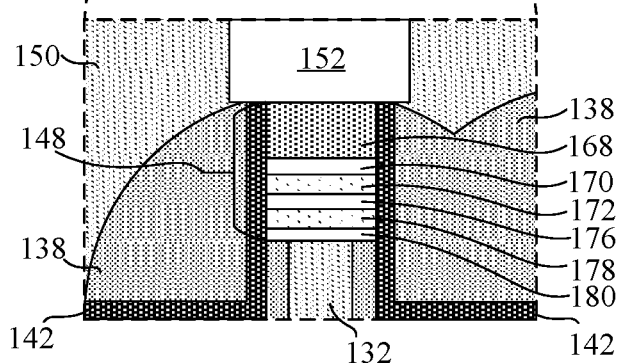
FIG. 1B is an enlarged view of part of the array of memory devices encircled by a dashed line, according to embodiments of the disclosure.

FIG. 1B is an enlarged view of part of the array of memory devices 108 encircled by a dashed line, according to embodiments of the disclosure. Referring to FIG. 1B, the first magnetic tunnel junction 148 may comprise a bottom electrode layer 180 over the first contact pillar 132. Although not shown, an antiferromagnetic layer may be formed over the bottom electrode layer 180. A ferromagnetic fixed layer 178 may be formed over the bottom electrode layer 180 or the antiferromagnetic layer. An insulating layer 176 may be formed over the ferromagnetic fixed layer 178. A ferromagnetic free layer 172 may be formed over the insulating layer 176. A capping layer 170 may be formed over the ferromagnetic free layer 172. A top electrode layer 168 may be formed over the capping layer 170.

Figure 1C:
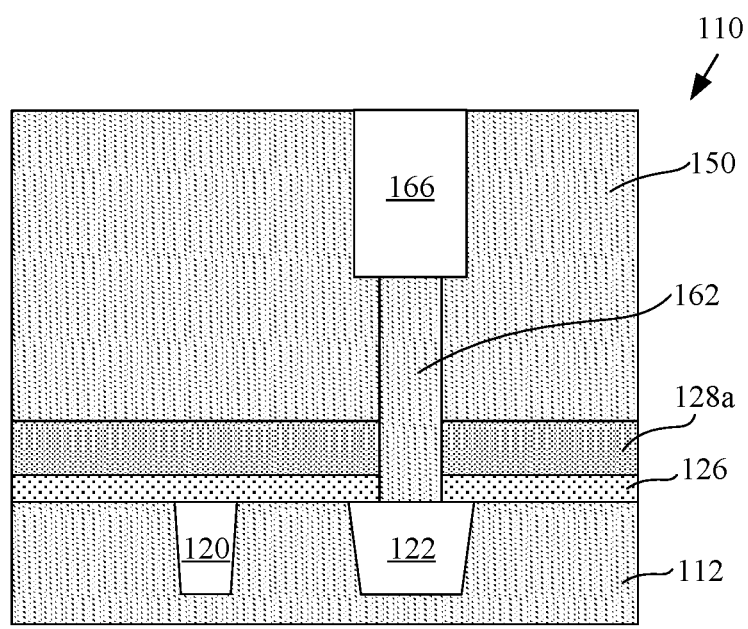
FIG. 1C is a cross-section view of a metallization structure in a corresponding logic device, according to embodiments of the disclosure.

FIG. 1C is a cross-section view of a metallization structure in a corresponding logic device 110, according to embodiments of the disclosure. The same reference numerals used in FIGS. 1A and 1B may be used in FIG. 1C to refer to identical features. Referring to FIG. 1C, the metallization structure in the corresponding logic device 110 may be fabricated simultaneously as the array of memory devices 108. Referring to FIG. 1C, the metallization structure in the corresponding logic device 110 may comprise a contact pillar 162 having a lower portion surrounded by the first portion of the dielectric layer 128a. An upper portion of the contact pillar 162 and an upper metallization layer 166 over the contact pillar 162 may be surrounded by the low dielectric constant material 150. The low dielectric constant material 150 may cover an upper surface of the first portion of the dielectric layer 128a.

A lower metallization layer 122 may contact a bottom portion of the contact pillar 162. The lower metallization layer 122 may be formed in the low dielectric constant material 112. The NBloK layer 126 may be formed above the low dielectric constant material 112 and the lower metallization layer 122 and below the first portion of the dielectric layer 128a. The NBloK layer 126 may serve as an etch stop layer during via etching for the contact pillars 132, 136 and 162. The NBloK layer 126 may be replaced with a nitride layer or a silicon carbon nitride (SiCN).

FIGS. 2A to 7A illustrate a fabrication process flow for the array of memory devices 108 illustrated in FIG. 1A, according to embodiments of the disclosure. FIGS. 2B to 7B illustrate a fabrication process flow for the metallization structure in the corresponding logic device 110 illustrated in FIG. 1C, according to embodiments of the disclosure.

Figure 2A:
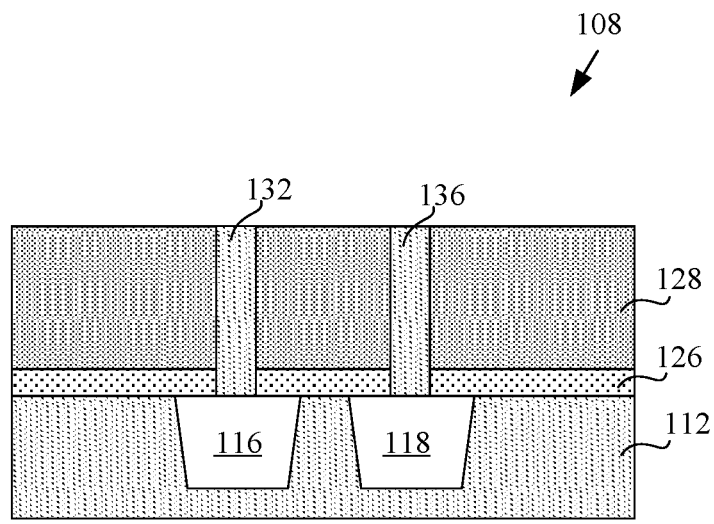

FIG. 2A is a cross-section view of a partially completed array of memory devices 108, according to embodiments of the disclosure. Referring to FIG. 2A, a first lower metallization layer 116 and a second lower metallization layer 118 may be formed in a low dielectric constant material 112. An NBLoK layer 126 may be formed above the low dielectric constant material 112, the first lower metallization layer 116 and the second lower metallization layer 118. A dielectric layer 128 may be formed above the NBLoK layer 126. A first contact pillar 132 and a second contact pillar 136 may be formed in the dielectric layer 128 and the NBLoK layer 126. In embodiments, the first contact pillar 132 and the second contact pillar 136 may have a height that is substantially equal to a height of the dielectric layer 128. A bottom portion of the first contact pillar 132 and the second contact pillar 136 may be over the first lower metallization layer 116 and the second lower metallization layer 118, respectively.

Figure 2B:
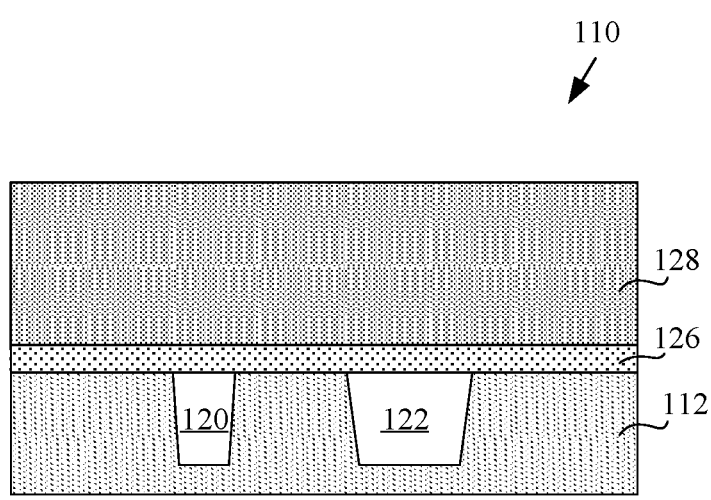

FIG. 2B is a cross-section view of a partially completed metallization structure in a corresponding logic device 110, according to embodiments of the disclosure. Referring to FIG. 2B, a lower metallization layer 122 may be formed in the low dielectric constant material 112. The NBLoK layer 126 may be formed over the lower metallization layer 122 and the low dielectric constant material 112. The dielectric layer 128 may be formed over the NBLoK layer 126.

Figure 3A:
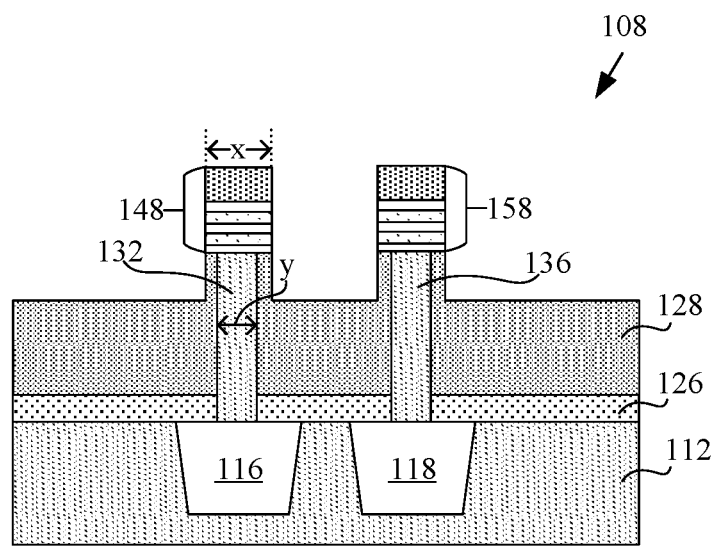

FIG. 3A is a cross-section view of a partially completed array of memory devices after formation of magnetic tunnel junctions, according to embodiments of the disclosure. Referring to FIG. 3A, a first magnetic tunnel junction 148 may be formed above the first contact pillar 132 and a second magnetic tunnel junction 158 may be formed above the second contact pillar 136. The formation of the first magnetic tunnel junction 148 and the second magnetic tunnel junction 158 is well known in the art and will not be further elaborated upon. In embodiments, the magnetic tunnel junctions 148 and 158 may have a width x that is longer than or equal to a width y of the contact pillars 132 and 136, respectively. The first magnetic tunnel junction 148 and the second magnetic tunnel junction 158 may be used as a masking layer to remove an upper portion of the dielectric layer 128. The removal process may be by a dry etch or wet etch process. The removal process may leave behind a part of the upper portion of the dielectric layer 128 below the first magnetic tunnel junction 148 and the second magnetic tunnel junction 158 and surrounding an upper portion of the first contact pillar 132 and the second contact pillar 136. In further embodiments, the removal process may completely remove the upper portion of the dielectric layer 128 to expose the upper portions of the first contact pillar 132 and the second contact pillar 136. In embodiments, the removal process may leave behind a lower portion of the dielectric layer 128 surrounding a lower portion of the first contact pillar 132 and the second contact pillar 136 and extending horizontally over the NBLoK layer 126.

Figure 3B:
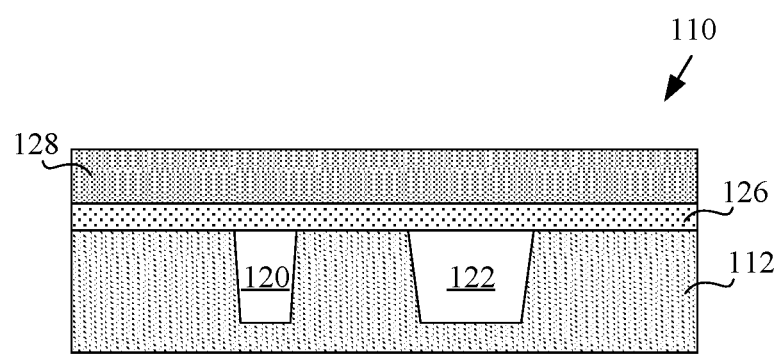

FIG. 3B is a cross-section view of a partially completed metallization structure in a corresponding logic device 110 after removal of an upper portion of the dielectric layer 128, according to embodiments of the disclosure. Referring to FIG. 3B, the removal process may leave behind a lower portion of the dielectric layer 128 extending horizontally over the NBLoK layer 126.

Figure 4A:
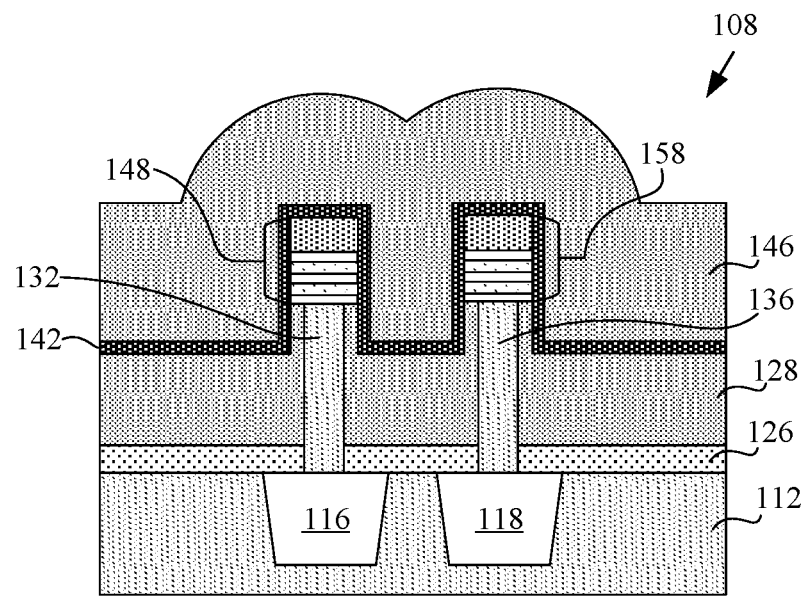

FIG. 4A is a cross-section view of a partially completed array of memory devices 108 after formation of a barrier layer 142 and a dielectric spacer material 146, according to embodiments of the disclosure. Referring to FIG. 4A, the barrier layer 142 may be deposited over a sidewall and a top surface of the first magnetic tunnel junction 148 and the second magnetic tunnel junction 158, over a sidewall of the upper portion of the dielectric layer 128 and over a horizontal surface of the lower portion of the dielectric layer 128. In further embodiments, the barrier layer 142 may be deposited over the upper portion of the first contact pillar 132 and the second contact pillar 136. A layer of dielectric spacer material 146 may be deposited over the barrier layer 142. The deposition processes for the barrier layer 142 and the dielectric spacer material 146 may be by chemical vapor deposition (CVD), atomic layer deposition (ALD), physical vapor deposition (PVD) or any other suitable deposition processes.

Figure 4B:
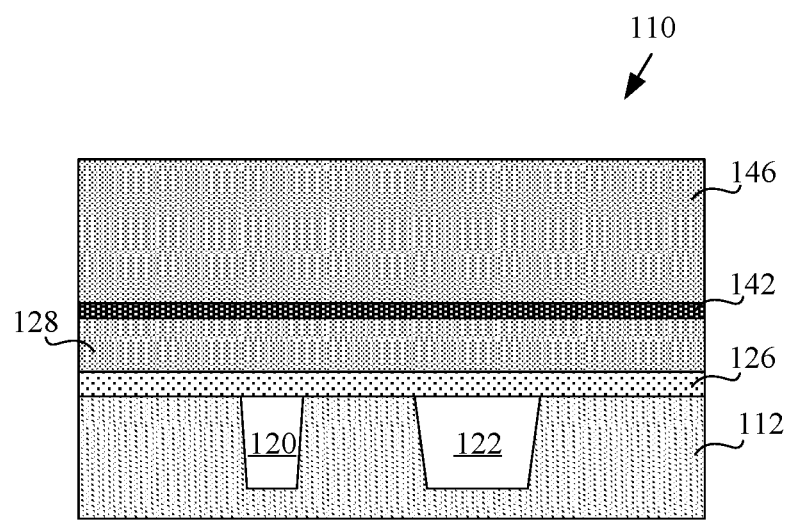

FIG. 4B is a cross-section view of a partially completed metallization structure in a corresponding logic device 110 after formation of the barrier layer 142, according to embodiments of the disclosure. The barrier layer 142 may be deposited over the horizontal surface of the dielectric layer 128. The layer of dielectric spacer material 146 may be deposited over the barrier layer 142.

Figure 5A:
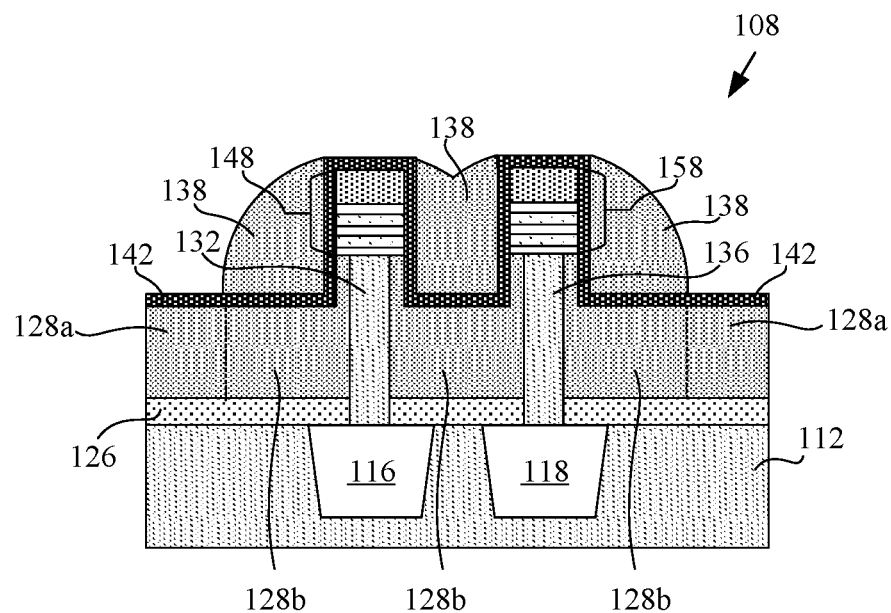

FIG. 5A is a cross-section view of a partially completed array of memory devices 108 after formation of a spacer 138, according to embodiments of the disclosure. Referring to FIG. 5A, the formation of a spacer 138 over the barrier layer 142 may include removing a first portion of the layer of dielectric spacer material 146 from the top surface of the first magnetic tunnel junction 148 and the top surface of the second magnetic tunnel junction 158 and a horizontal surface of a first portion of the dielectric layer 128a. The removal process may be by anisotropic etching. The term "anisotropic etching" may refer to an etching process that removes a material in a specific direction. The removal process may leave behind a second portion of the layer of dielectric spacer material 146 over the sidewall of the first magnetic tunnel junction 148 and the second magnetic tunnel junction 158 and a horizontal surface of a second portion of the dielectric layer 128b thereby forming the spacer 138.

Figure 5B:
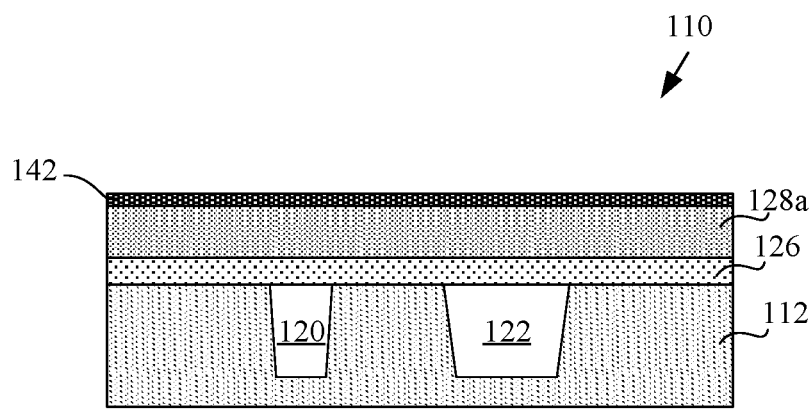

FIG. 5B is a cross-section view of a partially completed metallization structure in a corresponding logic device 110 after removal of the first portion of the layer of dielectric spacer material 146, according to embodiments of the disclosure. Referring to FIG. 3B, the removal process may leave behind the barrier layer 142 on the horizontal surface of the first portion of the dielectric layer 128a.

Figure 6A:
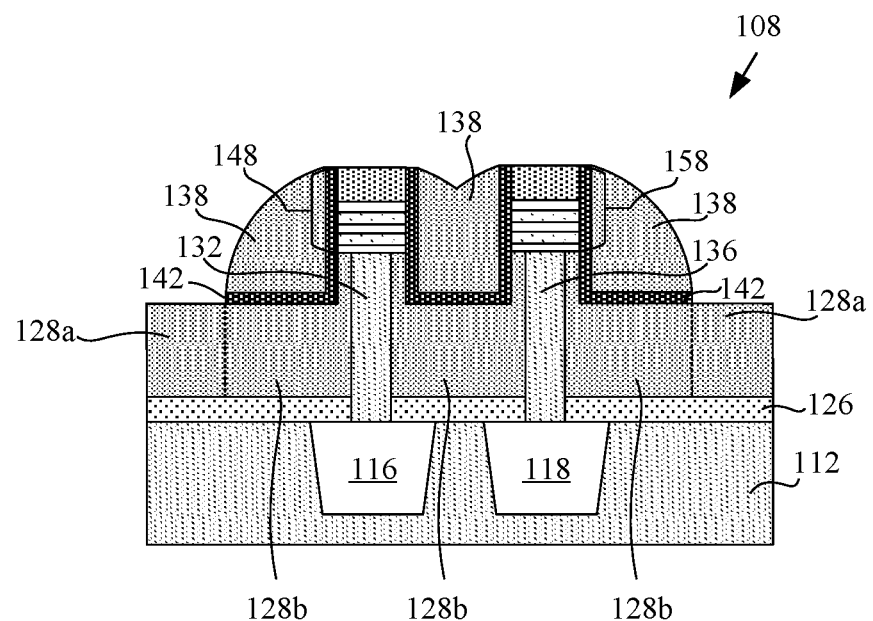

FIG. 6A is a cross-section view of a partially completed array of memory devices 108 after removal of a first portion of the barrier layer 142 from the horizontal surface of the first portion of the dielectric layer 128a and from the top surface of the first magnetic tunnel junction 148 and the second magnetic tunnel junction 158, according to embodiments of the disclosure. The removal process may be by a wet or dry etch and may leave behind a second portion of the barrier layer 142 on the sidewall of the first magnetic tunnel junction 148 and the second magnetic tunnel junction 158 and over the horizontal surface and a sidewall of the second portion of the dielectric layer 128b. In further embodiments, the removal process may leave behind the second portion of the barrier layer 142 over the upper portion of the first contact pillar 132 and the second contact pillar 136.

Figure 6B:
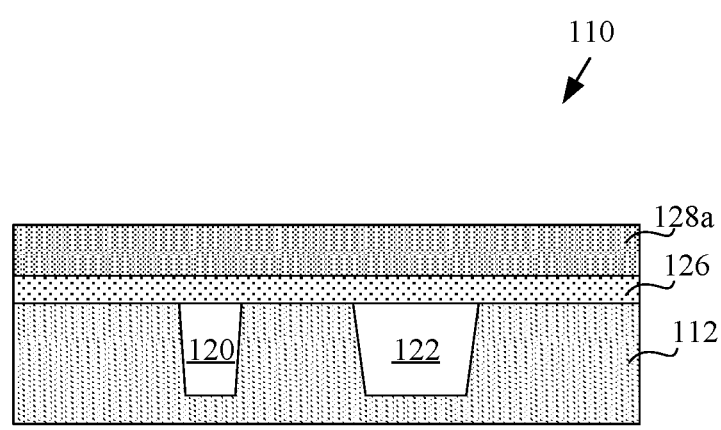

FIG. 6B is a cross-section view of a partially completed metallization structure in a corresponding logic device 110 after removal of the first portion of the barrier layer 142 from the horizontal surface of the first portion of the dielectric layer 128a, according to embodiments of the disclosure. The removal process may leave behind the first portion of the dielectric layer 128a over the NBLoK layer 126.

Figure 7A:
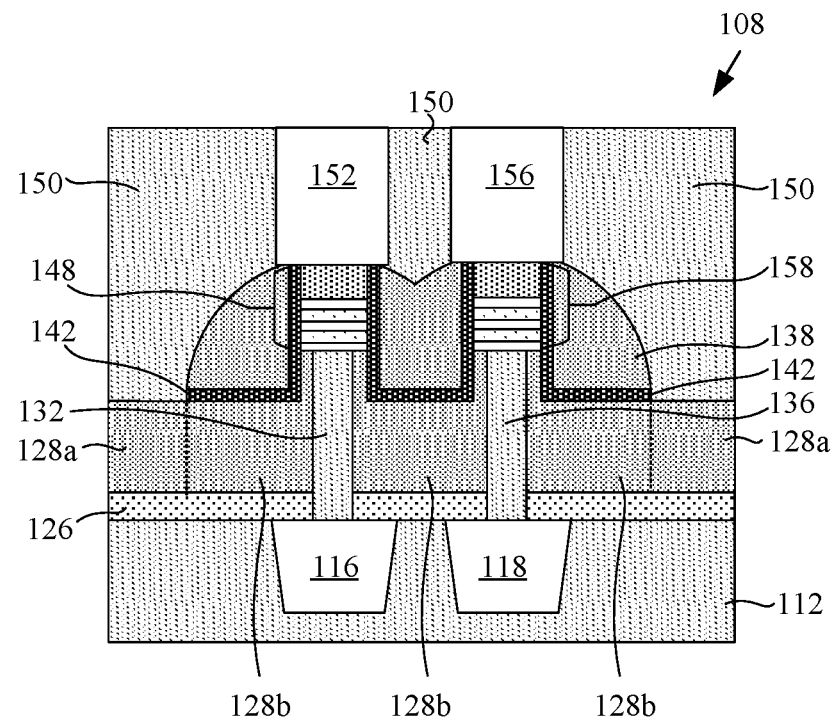

FIG. 7A is a cross-section view of an array of memory devices 108 after formation of a layer of low dielectric constant material 150, according to embodiments of the disclosure. Referring to FIG. 7A, the layer of low dielectric constant material 150 may be deposited over the spacer 138, the first magnetic tunnel junction 148, the second magnetic tunnel junction 158 and the dielectric layer 128. The deposition process may be by CVD, ALD, PVD or any other suitable deposition processes. A first upper metallization layer 152 may be formed over the first magnetic tunnel junction 148 and a second upper metallization layer 156 may be formed over the second magnetic tunnel junction 158. The first upper metallization layer 152 and the second upper metallization layer 156 may be formed in the low dielectric constant material 150. The formation of the first upper metallization layer 152 and the second upper metallization layer 156 is well known in the art and will not be further elaborated upon.

Figure 7B:
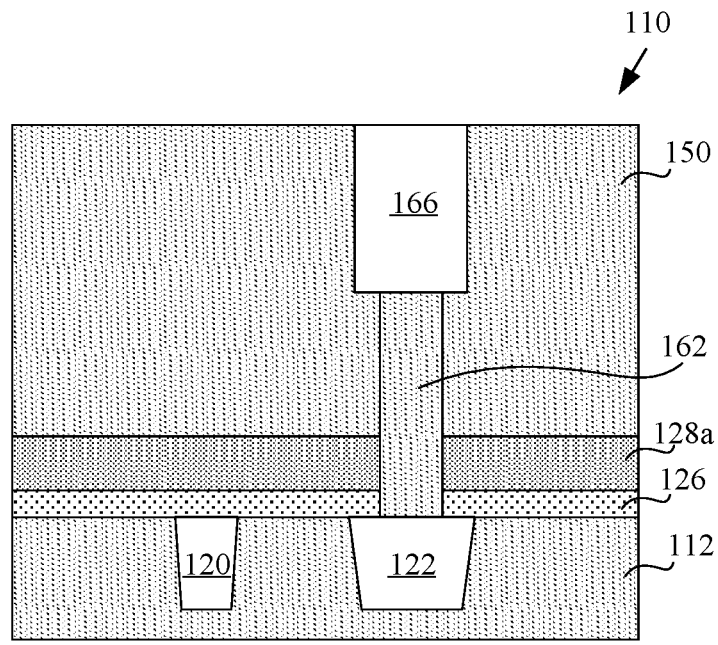

FIG. 7B is a cross-section view of a metallization structure in a corresponding logic device 110 after formation of the layer of low dielectric constant material 150, according to embodiments of the disclosure. Referring to FIG. 7B, the layer of low dielectric constant material 150 may be deposited over the first portion of the dielectric layer 128a. A contact pillar 162 may be formed in the layer of low dielectric constant material 150, the first portion of the dielectric layer 128a and the NBLoK layer 126. A bottom portion of the contact pillar 162 may be on the lower metallization layer 122. An upper metallization layer 166 may be formed over a top surface of the contact pillar 162. The formation of the contact pillar 162 and the upper metallization layer 166 are well known in the art and will not be further elaborated upon.

The terms "first", "second", "third", and the like in the description and in the claims, if any, are used for distinguishing between similar elements and not necessarily for describing a particular sequential or chronological order. It is to be understood that the terms so used are interchangeable under appropriate circumstances such that the embodiments of the device described herein are, for example, capable of operation in sequences other than those illustrated or otherwise described herein. The terms "left", "right", "front", "back", "top", "bottom", "over", "under", and the like in the description and in the claims, if any, are used for descriptive purposes and not necessarily for describing permanent relative positions. It is to be understood that the terms so used are interchangeable under appropriate circumstances such that the embodiments of the device described herein are, for example, capable of operation in other orientations than those illustrated or otherwise described herein. Similarly, if a method is described herein as comprising a series of steps, the order of such steps as presented herein is not necessarily the only order in which such steps may be performed, and certain of the stated steps may possibly be omitted and/or certain other steps not described herein may possibly be added to the method. Furthermore, the terms "comprise", "include", "have", and any variations thereof, are intended to cover a non-exclusive inclusion, such that a process, method, article, or device that comprises a list of elements is not necessarily limited to those elements, but may include other elements not expressly listed or inherent to such process, method, article, or device.

While several exemplary embodiments have been presented in the above detailed description of the device, it should be appreciated that number of variations exist. It should further be appreciated that the embodiments are only examples, and are not intended to limit the scope, applicability, dimensions, or configuration of the devices in any way. Rather, the above detailed description will provide those skilled in the art with a convenient road map for implementing an exemplary embodiment of the devices, it being understood that various changes may be made in the function and arrangement of elements and method of fabrication described in an exemplary embodiment without departing from the scope of this disclosure as set forth in the appended claims.

What is claimed is:

1. A memory device comprising:
   a contact pillar in a dielectric layer;
   a magnetic tunnel junction over the contact pillar;
   a barrier layer on a sidewall of the magnetic tunnel junction and extending over a horizontal surface and a sidewall of an upper portion of the dielectric layer, the upper portion of the dielectric layer is between the barrier layer and the contact pillar; and
   a spacer over the barrier layer.

2. The memory device of claim 1, wherein the barrier layer extends over an upper portion of the contact pillar.

3. The memory device of claim 2, wherein a width of the magnetic tunnel junction is equal to a width of the contact pillar.

4. The memory device of claim 1, wherein the spacer is on an upper surface and a sidewall of the barrier layer.

5. The memory device of claim 4, wherein the spacer completely covers the upper surface of the barrier layer.

6. The memory device of claim 1, wherein the spacer and the barrier layer completely cover the sidewall of the magnetic tunnel junction.

7. The memory device of claim 1 further comprising:
   a low dielectric constant material covering the spacer and the dielectric layer.

8. The memory device of claim 1, wherein the spacer is made of tetraethyl orthosilicate (TEOS) or silicon nitride.

9. The memory device of claim 7, wherein the low dielectric constant material comprises SiCOH or an ultra-low dielectric constant material.

10. The memory device of claim 1, wherein the dielectric layer comprises TEOS, SiCOH or silicon nitride.

11. An array of memory devices comprising:
    a first contact pillar and a second contact pillar in a dielectric layer;
    a first magnetic tunnel junction over the first contact pillar and a second magnetic tunnel junction over the second contact pillar;
    a barrier layer on a sidewall of the first magnetic tunnel junction and the second magnetic tunnel junction, wherein the barrier layer extends over a horizontal surface and a sidewall of an upper portion of the dielectric layer, the upper portion of the dielectric layer is between the barrier layer and the first contact pillar; and
    a spacer over the barrier layer.

12. The array of memory devices of claim 11, wherein the spacer is in a gap between the first magnetic tunnel junction and the second magnetic tunnel junction.

13. The array of memory devices of claim 12, wherein the spacer completely fills the gap in between the first magnetic tunnel junction and the second magnetic tunnel junction.

14. The array of memory devices of claim 11, further comprising:
    a low dielectric constant material covering the spacer and the dielectric layer.

15. A method of fabricating a memory device comprising:
    forming a contact pillar in a dielectric layer;
    forming a magnetic tunnel junction over the contact pillar;
    forming a barrier layer on a sidewall of the magnetic tunnel junction and over a horizontal surface of the dielectric layer;
    providing a spacer over the barrier layer by forming a dielectric spacer material over the barrier layer; and
    patterning the dielectric spacer material to leave behind a portion of the dielectric spacer material over a sidewall of the magnetic tunnel junction and the horizontal surface of the dielectric layer.

16. The method of claim 15 further comprising:
    patterning the dielectric layer using the magnetic tunnel junction as a masking layer to leave behind a portion of the dielectric layer below the magnetic tunnel junction.

17. The method of claim 16, wherein providing the barrier layer on a sidewall of the magnetic tunnel junction and over a horizontal surface of the dielectric layer further comprises:
    providing the barrier layer over the portion of the dielectric layer below the magnetic tunnel junction.

* * * * *